United States Patent
Kim et al.

(10) Patent No.: US 9,935,278 B2
(45) Date of Patent: Apr. 3, 2018

(54) DISPLAY APPARATUS AND PORTABLE TERMINAL

(71) Applicant: SAMSUNG DISPLAY CO., LTD., Yongin-si, Gyeonggi-Do (KR)

(72) Inventors: Minseop Kim, Cheonan-si (KR); Won-il Lee, Cheonan-si (KR); Younhwan Jung, Hwaseong-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/935,475

(22) Filed: Nov. 9, 2015

(65) Prior Publication Data

US 2016/0268523 A1    Sep. 15, 2016

(30) Foreign Application Priority Data

Mar. 10, 2015    (KR) .................. 10-2015-0033347

(51) Int. Cl.
*H01L 29/08*    (2006.01)
*H01L 35/24*    (2006.01)
*H01L 51/00*    (2006.01)
*G02F 1/1333*    (2006.01)
*G06F 1/16*    (2006.01)
*H01L 51/52*    (2006.01)

(52) U.S. Cl.
CPC .... *H01L 51/0096* (2013.01); *G02F 1/133308* (2013.01); *G06F 1/1637* (2013.01); *H01L 51/529* (2013.01); *H01L 51/5284* (2013.01); *G02F 2001/133311* (2013.01)

(58) Field of Classification Search
CPC ......... H01L 27/3272; H01L 2251/5338; H01L 51/0097; H01L 29/78633; H01L 27/28; H05K 1/181; H05K 5/0017; H05K 7/20963; H05K 1/0274
USPC .............. 257/40; 438/26; 345/173; 313/511; 361/704
See application file for complete search history.

(56) References Cited

U.S. PATENT DOCUMENTS

| | | | |
|---|---|---|---|
| 8,947,866 B2 | 2/2015 | Jacobs et al. | |
| 2010/0085692 A1* | 4/2010 | Kim ................. | B29C 45/14811 361/679.01 |
| 2011/0109596 A1* | 5/2011 | Yoon ................... | H01L 27/3272 345/204 |

(Continued)

FOREIGN PATENT DOCUMENTS

| KR | 10-2014-0002491 A | 1/2014 |
|---|---|---|
| KR | 10-2014-0046839 A | 4/2014 |

(Continued)

OTHER PUBLICATIONS

European Search Report dated Jul. 25, 2016 in Corresponding European Patent Application No. 16154757.5.

*Primary Examiner* — Lex Malsawma
*Assistant Examiner* — Nduka Ojeh
(74) *Attorney, Agent, or Firm* — Lee & Morse, P.C.

(57) ABSTRACT

A display apparatus including a display panel, a buffer, and a curved buffer. The display panel includes a curved portion connected to a flat portion. The buffer overlaps the flat portion and having a first thickness. The curved buffer is on a same layer as the buffer and overlaps the curved portion, the curved buffer having a second thickness greater than the first thickness.

21 Claims, 9 Drawing Sheets

(56) References Cited

U.S. PATENT DOCUMENTS

| | | | | |
|---|---|---|---|---|
| 2012/0020056 | A1* | 1/2012 | Yamagata | G02F 1/133308 362/97.1 |
| 2012/0113614 | A1* | 5/2012 | Watanabe | G02F 1/13336 361/810 |
| 2013/0002133 | A1* | 1/2013 | Jin | H01L 51/524 313/511 |
| 2014/0168090 | A1* | 6/2014 | Aaltonen | G06F 1/1601 345/173 |
| 2014/0370222 | A1* | 12/2014 | Kim | F28F 21/081 428/40.9 |
| 2015/0029661 | A1 | 1/2015 | Huang et al. | |
| 2015/0108439 | A1* | 4/2015 | Kim | H01L 51/5256 257/40 |
| 2016/0093683 | A1* | 3/2016 | Lee | H01L 51/0097 257/40 |

FOREIGN PATENT DOCUMENTS

| | | |
|---|---|---|
| KR | 10-2014-0128721 A | 11/2014 |
| KR | 10-2014-0141330 A | 12/2014 |

* cited by examiner

DISPLAY APPARATUS AND PORTABLE TERMINAL

CROSS-REFERENCE TO RELATED APPLICATION

Korean Patent Application No. 10-2015-0033347, filed on Mar. 10, 2015, and entitled, "Display Apparatus and Portable Terminal," is incorporated by reference herein in its entirety.

BACKGROUND

1. Field

One or more embodiments described herein relate to a display apparatus and a portable terminal.

2. Description of the Related Art

Portable terminals usually have display panels for displaying images. A window member may also be included for controlling the appearance of the terminal. The display panels and window members have traditionally had a square or cube shape. Recently, curved display panels and window members have been developed. Curved display panels and window members have been shown to be especially vulnerable to damage from external impact.

SUMMARY

In accordance with one or more embodiments, a display apparatus includes a display panel including a curved portion connected to a flat portion; a buffer overlapping the flat portion and having a first thickness; and a curved buffer on a same layer as the buffer and overlapping the curved portion, the curved buffer having a second thickness greater than the first thickness. The curved portion may include a first curved portion facing a second curved portion, and the flat portion may be between the first and second curved portions.

The first curved portion may be substantially parallel to the second curved portion, and the curved buffer may include a first curved buffer overlapping the first curved portion and a second curved buffer overlapping the second curved portion. The first curved buffer may overlap the first curved portion and a first portion of the flat portion connected to the first curved portion, and the second curved buffer may overlap the second curved portion and a second portion of the flat portion connected to the second curved portion. The second thickness may be substantially one and half times greater than the first thickness.

The display apparatus may include a light blocking layer between the display panel and the buffer and between the display panel and the curved buffer. The display apparatus include a heat discharge layer facing the display panel, wherein the buffer may be between the heat discharge layer and the display panel. The heat discharge layer may overlap the flat portion and does not overlap the curved portion.

The heat discharge layer may have a third thickness, and a sum of the first thickness and the third thickness may be substantially equal to or less than the second thickness. The curved portion may be adjacent to the flat portion in a first direction and extends in a second direction crossing the first direction, and the heat discharge layer may include a graphite layer; a heat discharge adhesive layer between and to attach the buffer and the graphite layer; a protective layer facing the heat discharge adhesive layer, with the graphite layer between the heat discharge adhesive layer and the protective layer; and a blocking layer overlapping a portion of a side surface of the graphite layer in the first direction or the second direction.

The heat discharge layer may include a first side extending in the first direction, a second side substantially parallel to the first side, a third side extending in the second direction, and a fourth side substantially parallel to the third side, and the blocking layer may include a first blocking layer extending along the first side and a second blocking layer extending along the second side. The first and second blocking layers may face each other in the second direction, and the heat discharge adhesive layer, the graphite layer, and the protective layer may be between the first and second blocking layers.

The blocking layer may include a third blocking layer extending along the third side; and a fourth blocking layer extending along the fourth side. The third and fourth blocking layers may face each other in the first direction, and the heat discharge adhesive layer, the graphite layer, and the protective layer may be between the third and fourth blocking layers. The display apparatus may include an emission layer facing the display panel, wherein the buffer and the curved buffer may be between the emission layer and the display panel. The emission layer may be attached to the curved buffer.

In accordance with one or more other embodiments, a portable terminal includes a display panel including a curved portion connected to a flat portion; a buffer overlapping the flat portion and having a first thickness; and a curved buffer on a same layer as the buffer and overlapping the curved portion, the curved buffer having a second thickness greater than the first thickness. The portable terminal may include a light blocking layer between the display panel and the buffer and between the display panel and the curved buffer; a heat discharge layer overlapping the flat portion, not overlapping the curved portion, and facing the display panel, wherein the buffer is between the heat discharge layer and the display panel; and an emission layer facing the display panel, wherein the buffer and the curved buffer are between the emission layer and the display panel and are attached to the curved buffer and the heat discharge layer. The portable terminal may include a window above the display panel; and a bracket facing the display panel, wherein the buffer and the curved buffer are between the bracket and the display panel. The display panel may be an organic light emitting display panel.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
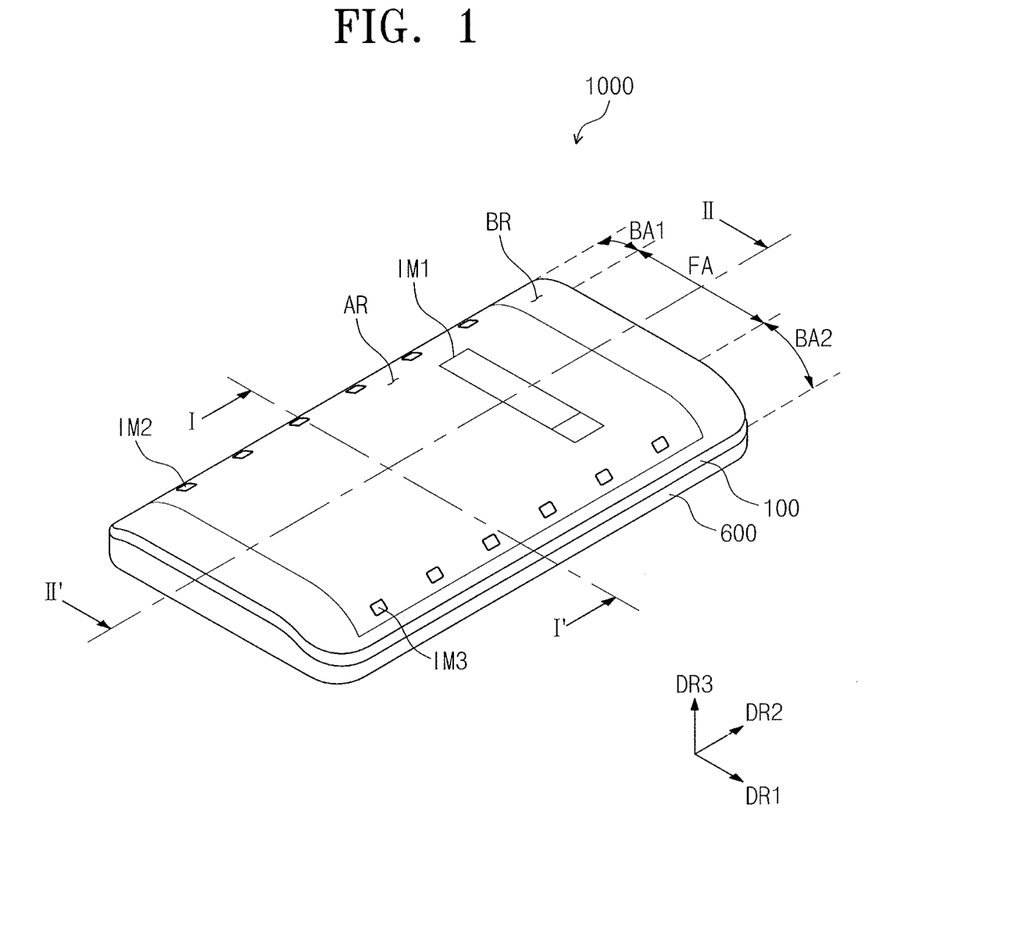
FIG. 1 illustrates an embodiment of a display apparatus.
Figure 2:
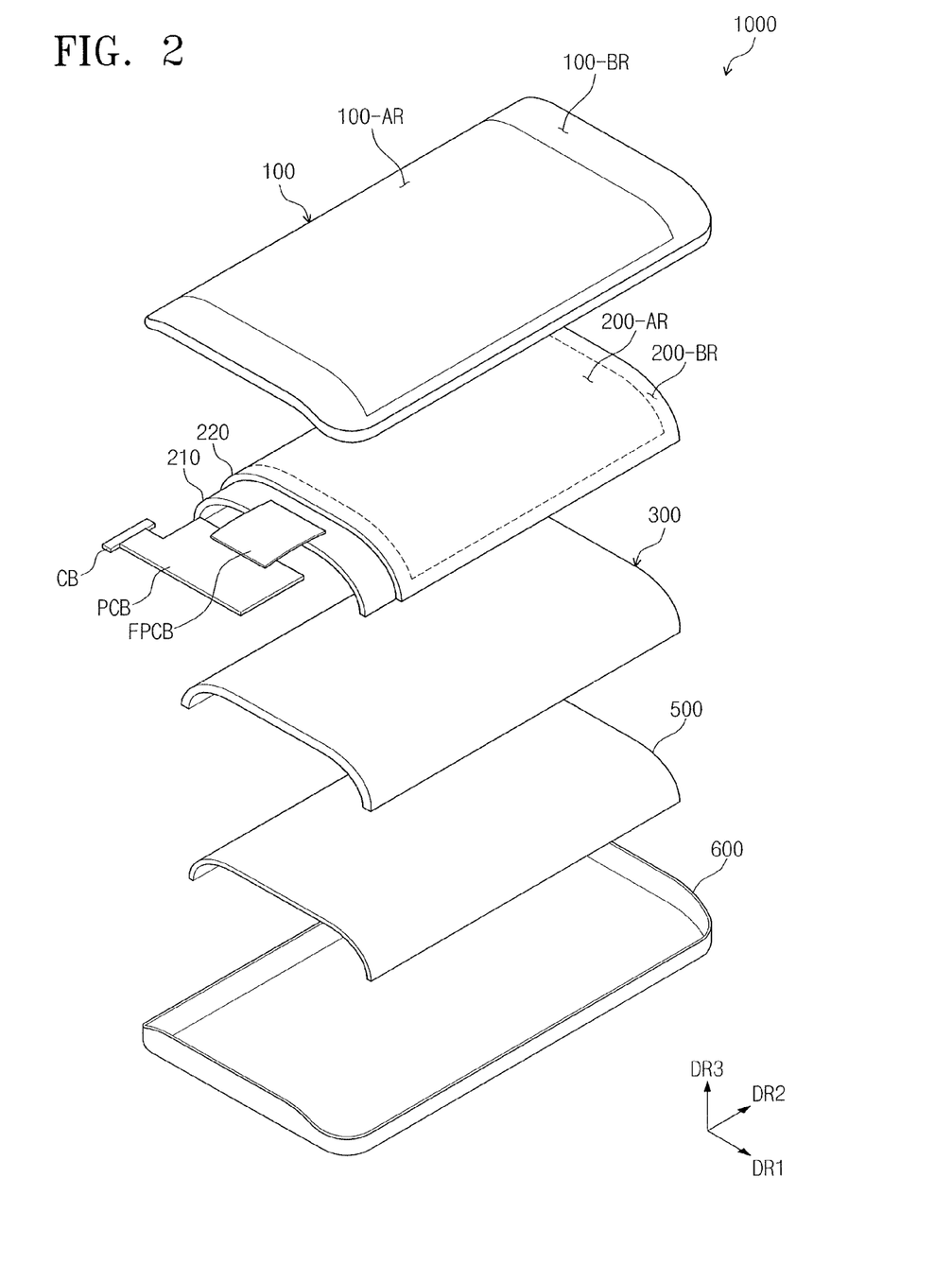
FIG. 2 illustrates another view of the display apparatus.

FIG. 1 illustrates an embodiment of a display apparatus 1000, and FIG. 2 illustrates an exploded perspective view of the display apparatus 1000. The display apparatus 1000 may be included, for example, in a portable terminal. The portable terminal may be, for example, a personal computer (PC), a tablet PC, a notebook computer, a car navigation unit, a camera, a personal digital assistant (PDA), a portable multimedia player (PMP), a game unit, or a wrist-type electronic device. The display apparatus 1000 may also be applied to a large-sized electronic item such as but not limited to a television set or an outdoor billboard.

As shown in FIG. 1, the display apparatus 1000 includes a plurality of areas defined on a display surface. The display apparatus 1000 includes a display area AR through which images IM1 and IM2 are displayed and a non-display area BR adjacent to the display area AR. The display area AR may have, for example, substantially a quadrangular shape or another shape. The non-display area BR surrounds the display area AR.

The display apparatus 1000 may have a curved portion. For example, the display apparatus 1000 may include a flat portion FA and curved portions adjacent to the flat portion FA. The flat portion FA is substantially parallel to a surface defined by a first direction DR1 and a second direction DR2 and a normal line of the flat portion FA corresponds to a third direction DR3. The third direction DR3 may be, for example, a reference direction for distinguishing a front surface from a rear surface.

The curved portions include a first curved portion BA1 and a second curved portion BA2. The first and second curved portions BA1 and BA2 are spaced from each other in the first direction DR1, and the flat portion FA is between the first and second curved portions BA1 and BA2. The first and second curved portions BA1 and BA2 extend in the second direction DR2. The embodiment of FIG. 1 has two curved portions BA1 and BA2. In another embodiment, one curved portion (e.g., only one of the first or second curved portions BA1 and BA2) or more than two curved portions may be included.

The display area AR has one portion disposed in the flat portion FA and other portions in the curved portions BA1 and BA2. The flat portion FA displays a first image IM1 and the curved portions BA1 and BA2 display second and third images IM2 and IM3, respectively. For illustrative purposes only, FIG. 1 shows that the first image IM1 includes an internet search window. The second and third images IM2 and IM3 may include various icons, images, and/or other information. In another embodiment, only one curved portion may be exist.

Referring to FIGS. 1 and 2, the display apparatus 1000 includes a window member 100, a display panel 200, a cover panel 300, a bracket 500, and a rear case 600. In one embodiment, each of the window member 100, the display panel 200, the cover panel 300, and the bracket 500 may have a partially curved shape. For example, each of the window member 100, the display panel 200, the cover panel 300, and the bracket 500 may include a flat portion and at least one curved portion. The flat portion of each of the window member 100, the display panel 200, the cover panel 300, and the bracket 500 may correspond to the flat portion FA of the display apparatus 1000. The at least one curved portion of each of the window member 100, the display panel 200, the cover panel 300, and the bracket 500 may correspond to the curved portions BA1 and BA2 of the display apparatus 1000.

For the convenience of explanation, the flat portion FA and the curved portions BA1 and BA2 may be used to indicate the flat portion and the curved portion of each of the window member 100, the display panel 200, the cover panel 300, and the bracket 500. For instance, the flat portion of the display panel 200 may indicate a portion of the display panel 200, which forms the flat portion FA.

The window member 100 includes a display area 100-AR for transmitting the images IM1 and IM2 from the display panel 200 and a non-display area 100-BR adjacent to the display area 100-AR. The window member 100 is above the display panel 200. The window member 100 may include a cover window made of, for example, glass, sapphire, or plastic.

The display panel 200 includes a display area 200-AR and a non-display area 200-BR. The display area 200-AR displays the images IM1 and IM2 and corresponds to the display area 100-AR of the window member 100. The non-display area 200-BR is adjacent to the display area 200-AR and corresponds to the non-display area 100-BR of the window member 100.

The display panel 200 may be, for example, an organic light emitting display panel. In this case, the display panel 200 includes a substrate 210, an organic light emitting diode, and a sealing. The organic light emitting diode is on the substrate 210. The sealing layer 230 is on the substrate 210 and seals the organic light emitting diode from the outside environment.

The organic light emitting diode includes a first electrode, an organic light emitting layer, and a second electrode. The first electrode is an anode electrode or a positive electrode. The second electrode is a cathode electrode or a negative electrode. The first electrode generates holes and the second electrode generates electrons. The holes generated by the first electrode and electrons generated by the second electrode are injected into the organic light emitting layer. The holes and electrons injected into the organic light emitting layer are recombined in the organic light emitting layer to generate excitons. Light is emitted when the excitons transition to a ground state from an excited state.

The display panel 200 includes a display surface on which the images IM1 and IM2 are displayed and a rear surface opposite to the display surface. In FIG. 2, the display surface corresponds to an upper surface of the sealing layer 230 and the rear surface corresponds to a lower surface of the substrate 210.

The display apparatus 1000 may further include a flexible printed circuit board FPCB and a printed circuit board PCB. The flexible printed circuit board FPCB electrically connects the display panel 200 and the printed circuit board PCB. One end of the flexible printed circuit board FPCB is connected to one surface of the substrate 210, which is not covered by the sealing layer 230. The other end of the flexible printed circuit board FPCB is connected to the printed circuit board PCB. The flexible printed circuit board FPCB has flexibility. Thus, the flexible printed circuit board FPCB is bent to a lower side of the cover panel 300 while being coupled to the printed circuit board PCB.

The printed circuit board PCB applies signals to or receives signals from the display panel 200 through the flexible printed circuit board FPCB. The printed circuit board PCB is attached to the lower side of the cover panel 300 due to bending of the flexible printed circuit board FPCB. The printed circuit board PCB may be connected to a connector CB to receive a signal from an external source.

The display apparatus 1000 may include a touch panel between the window member 100 and the display panel 200. The touch panel may be, for example, inside the display panel 200. The touch panel may be a resistive type touch panel, an electrostatic capacitive type touch panel, or an electromagnetic induction type touch panel and operates to obtain coordinate information corresponding to a touch position.

The cover panel 300 is attached to the rear surface of the display panel 200, and is between the display panel 200 and the printed circuit board PCB when coupled together.

The bracket 500 supports the display panel 200 and the cover panel 300. One surface of the bracket 500 is attached to the cover panel 300 and electronic components are mounted on the other surface of the bracket 500.

The rear case 600 is coupled to the window member 100 to accommodate the display panel 200 and cover panel 300. The rear case 600 is made of, for example, a plastic or metallic material. The rear case 600 may be omitted in another embodiment.

Figure 3:
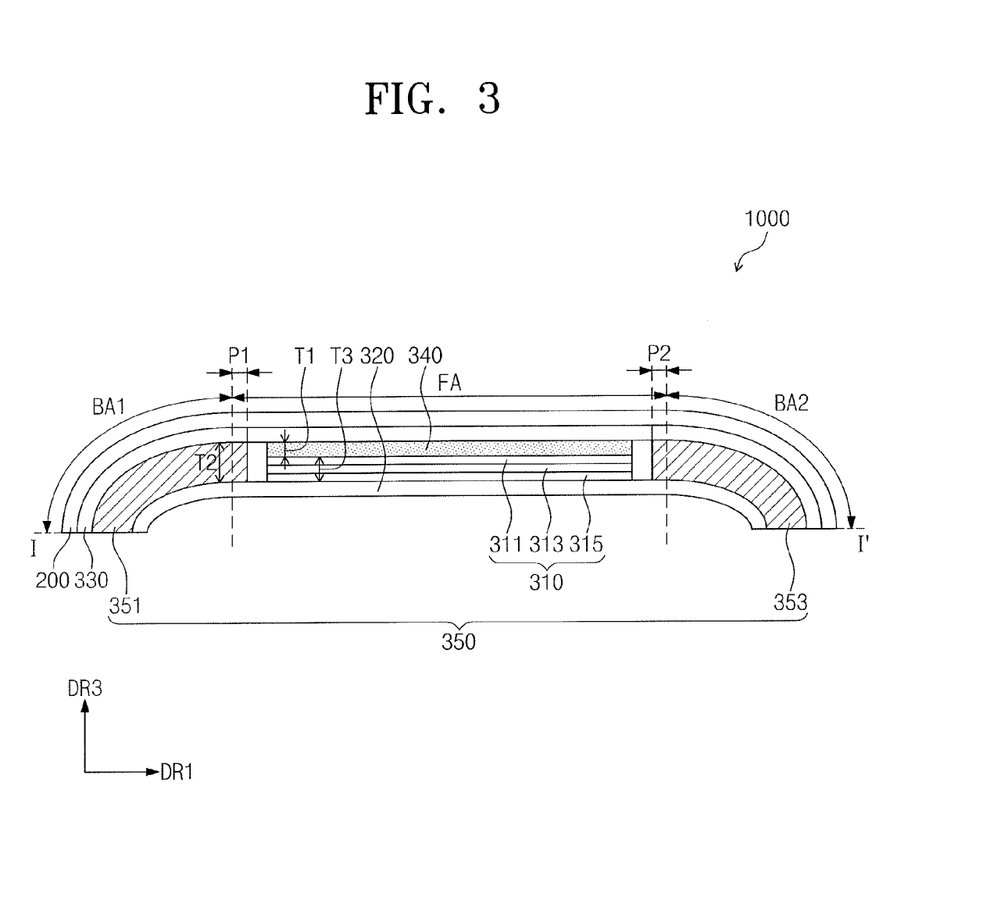
FIG. 3 illustrates a view along section line I-I in FIG. 1.
Figure 4:
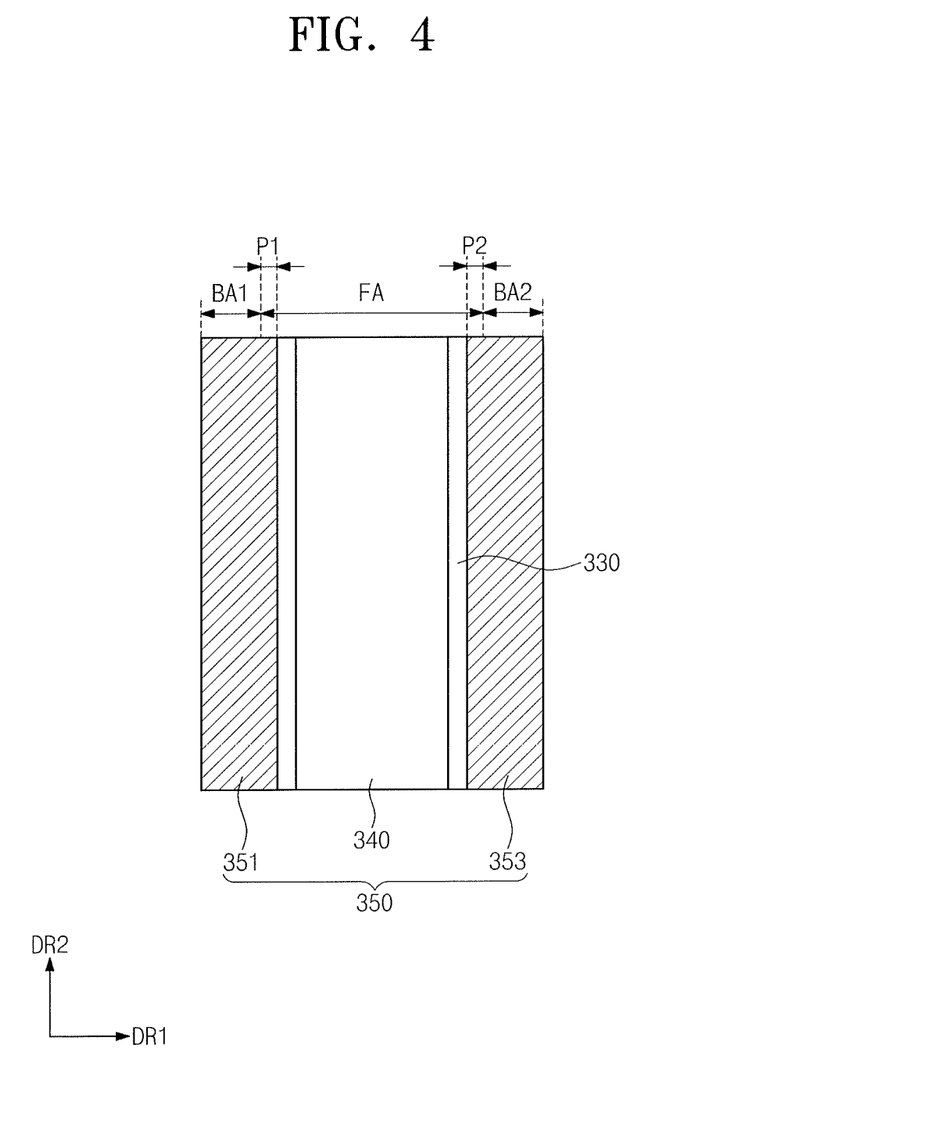
FIG. 4 illustrates the rear surface of an embodiment of a module.

FIG. 3 is a cross-sectional view taken along line I-I in FIG. 1, and FIG. 4 is a plan view showing an embodiment of a rear surface of a module formed by coupling a light blocking member 330, a buffering member 340, and a curved buffering member 350 in FIG. 3. For the convenience of explanation, the window member 100, the bracket 500, and the rear case 600 are omitted in FIG. 3.

Referring to FIGS. 2 to 4, the cover panel 300 includes the buffering member 340 and the curved buffering member 350. The buffering member 340 faces the display surface of the display panel 200 such that the rear surface of the display panel 200 is between the buffering member 340 and the display surface of the display panel 200. The buffering member 340 overlaps the flat portion FA. The buffering member 340 has an area smaller than that of the flat portion FA when viewed in a plan view. Thus the buffering member 340 is covered by the flat portion FA. The buffering member 340 has a first thickness T1.

The buffering member 340 absorbs part of the impact on the flat portion of the display panel 200 and the flat portion of the window member 100. Thus, the buffering member 340 may reduce or prevent damage to the display panel 200 and the window member 100. The buffering member 340 may be formed of, for example, a polymer resin, e.g., polyurethane, polycarbonate, polypropylene, polyethylene, etc., or may be formed from a rubber solution, a urethane-based material, or a sponge obtained, for example, by foaming/molding an acrylic-based material.

The curved buffering member 350 is on the same layer as the buffering member 340. The curved buffering member 350 overlaps the curved portions BA1 and BA2. The curved buffering member 350 has an area greater than that of the curved portions BA1 and BA2 when viewed in a plan view to cover the curved portions BA1 and BA2. The curved buffering member 350 has a second thickness T2 greater than the first thickness T1. In one embodiment, the second thickness T2 is one and half times greater than the first thickness T1. When T2>T1, and especially when T2=1.5T1, the thickness of the display apparatus 1000 may be reduced and impact resistance of the flat portion FA and the curved portions BA1 and BA2 may be improved.

The curved buffering member 350 may be formed of, for example, a polymer resin, e.g., polyurethane, polycarbonate, polypropylene, polyethylene, etc., or may be formed from a rubber solution, a urethane-based material, or a sponge obtained, for example, by foaming/molding an acrylic-based material.

The curved buffering member 350 absorbs part of the impact on the curved portion of the display panel 200 and the curved portion of the window member 100. Thus, the curved buffering member 350 may reduce or prevent damage to the display panel 200 and the window member 100 from external impact.

The curved portion of the window member 100 may be more vulnerable to impact than the flat portion of the window member 100, since the curved portion of the window member 100 may receive greater stress than applied to the flat portion of the window member 100.

Similarly, the curved portion of the display panel 200 may be more vulnerable to impact than the flat portion of the display panel 200, since the curved portion of the display panel 200 may receive greater stress than applied to the flat portion of the display panel 200. In addition, pixels in the curved portion of the display panel 200 may receive greater stress than applied to pixels in the flat portion of the display panel 200. As a result, the pixels in the curved portion of the display panel 200 may not properly display images, e.g., images displayed using the pixels in the curved portion of the display panel 200 may be perceived as including a white spot or a black spot.

In the display apparatus 1000, the curved buffering member 350 has a thickness greater than the buffering member 340. Thus, the impact resistance of the curved portions BA1 and BA2 may be improved. In addition, images displayed using pixels in the curved portions BA1 and BA2 may be prevented from being perceived as including a white or black spot. Further, differences in impact resistance between the flat portion FA and the curved portions BA1 and BA2 may be reduced.

The curved buffering member 350 includes a first curved buffering member 351 and a second curved buffering member 353. The first and second curved buffering members 351 and 353 face each other, with the buffering member 340 between the first and second curved buffering members 351 and 353. Each of the first and second curved buffering members 351 and 353 may have, for example, substantially a rectangular shape extending in the second direction DR2.

The first curved buffering member 351 covers the first curved portion BA1 of the display panel 200. The first curved buffering member 351 covers a first portion P1 of the flat portion FA, which is connected to the first curved portion BA1. The second curved buffering member 353 covers the second curved portion BA2 of the display panel 200. The second curved buffering member 353 covers a second portion P2 of the flat portion FA, which is connected to the second curved portion BA2.

The cover panel 300 may include a light blocking member 330 between the display panel 200 and the buffering member 340 and between the display panel 200 and the curved buffering member 350. The light blocking member 330 is attached to the rear surface of the display panel 200 to block the light incident on the display panel 200. The light blocking member 330 absorbs or reflects the incident light.

Figure 5:
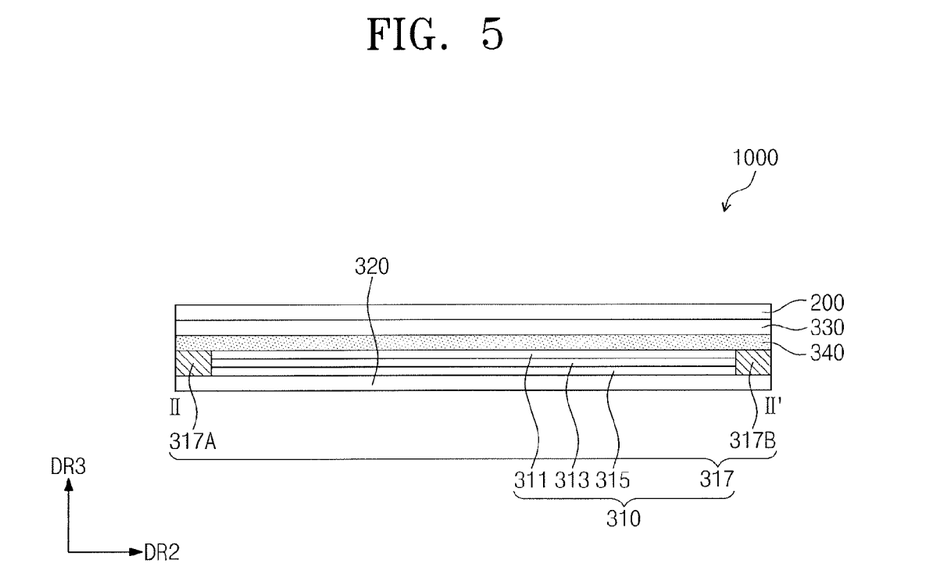
FIG. 5 illustrates a view along section line II-II' in FIG. 1.
Figure 6:
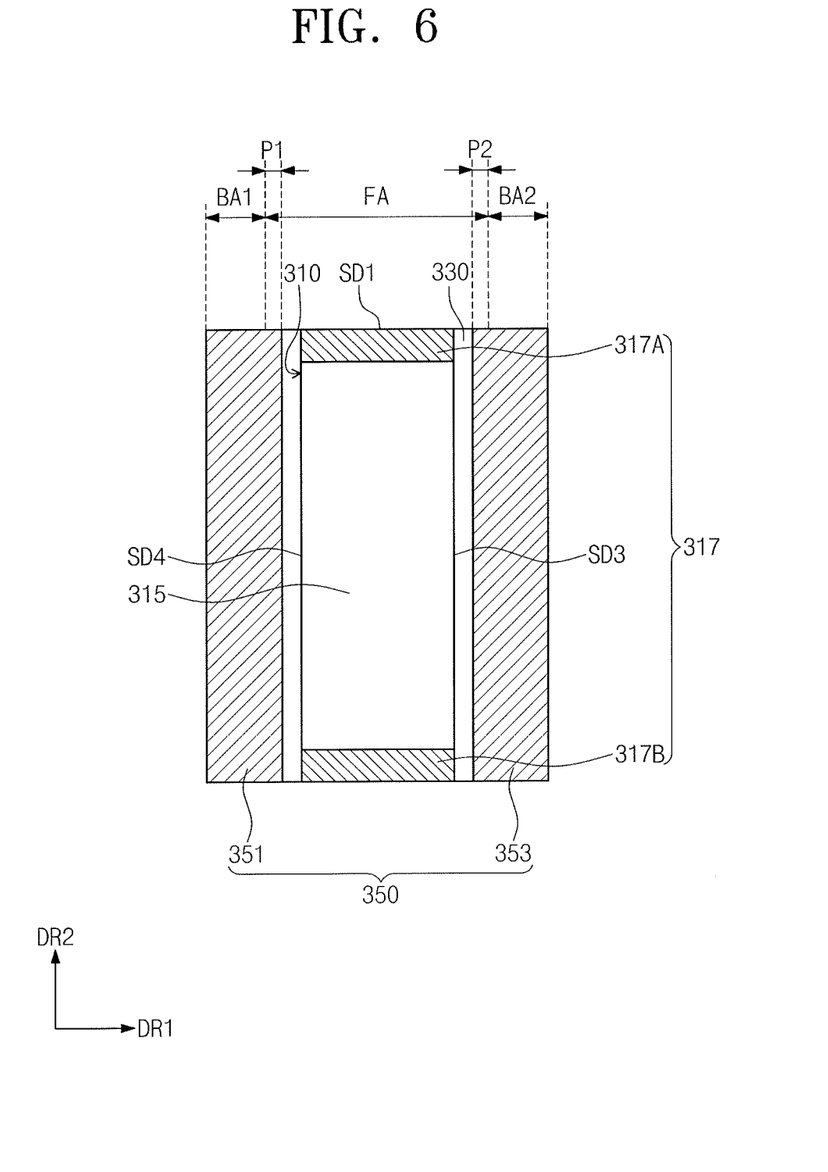
FIG. 6 illustrates the rear surface of another embodiment of a module.

FIG. 5 is a cross-sectional view taken along a line II-II' of FIG. 1, and FIG. 6 is a plan view showing an embodiment of a rear surface of a module formed by coupling the light blocking member 330, the buffering member 340, the curved buffering member 350, and a heat discharge member 310 in FIG. 3.

Referring to FIGS. 3, 5, and 6, the cover panel 300 includes the heat discharge member 310 facing the display panel 200, with the buffering member 340 between the heat discharge member 310 and the display panel 200. The heat discharge member 310 is attached to the rear surface of the buffering member 340 to effectively discharge heat generated from the display panel 200.

The heat discharge member 310 overlaps the flat portion FA and does not overlap the curved portions BA1 and BA2. The heat discharge member 310 is covered by the buffering member 340 when viewed in a plan view. The heat discharge member 310 has a third thickness T3. In one embodiment, the sum of the first thickness T1 and the third thickness T3 may be equal to or less than the second thickness T2. In FIG. 3, the sum of the first thickness T1 and the third thickness T3 is equal to the second thickness T2. Accordingly, the display apparatus 1000 may have superior heat discharge properties without realizing increased thickness. Also, the difference in impact resistance between the flat portion FA and curved portions BA1 and BA2 may be reduced.

The heat discharge member 310 includes a heat discharge adhesive layer 311, a graphite layer 313, a protective layer 315, and a blocking layer 317. The heat discharge adhesive layer 311 is between and attached the buffering member 340 and the graphite layer 313. The heat discharge adhesive layer 311 may include an optical clear adhesive (OCA) or an optical clear resin (OCR).

The graphite layer 313 includes graphite molecules which have a plate structure in which carbon atoms are connected to each other in a horizontal direction. Therefore, heat conductivity in the horizontal direction of the graphite layer 313 is higher than heat conductivity in a vertical direction of the graphite layer 313. Thus, the graphite layer 313 may demonstrate superior heat discharge properties.

The protective layer 315 faces the heat discharge adhesive layer 311, with the graphite layer 313 between the protective layer 315 and the heat discharge adhesive layer 311. The protective layer 315 prevents the graphite molecules of the graphite layer 313 from blowing. The protective layer 315 may include, for example, polyethylene terephthalate (PET).

The blocking layer 317 is on the buffering member 340, which covers a portion of side surface of the graphite layer 313 along a direction substantially parallel to an upper or rear surface of the graphite layer 313. In FIG. 6, the blocking layer 317 covers the side surface of the graphite layer 313 in the second direction DR2 and exposes the side surface of the graphite layer 313 in the first direction DR1. The blocking layer 317 may include, for example, polyethylene terephthalate (PET).

The heat discharge member 310 may have, for example, a quadrangular shape. The heat discharge member 310 includes first, second, third, and fourth sides SD1, SD2, SD3, and SD4. The first and second sides SD1 and SD2 are substantially parallel to and face each other, and extend in the first direction DR1. The third and fourth sides SD3 and SD4 are substantially parallel to and face each other, and extend in the second direction DR2.

The blocking layer 317 includes a first blocking layer 317A and a second blocking layer 317B. The first blocking layer 317A extends along the first side SD1 and the second blocking layer 317B extends along the second side SD2. The first and second blocking layers 317A and 317B face each other in the second direction DR2. The heat discharge adhesive layer 311, the graphite layer 313, and the protective layer 315 are between the first and second blocking layers 317A and 317B.

Referring again to FIGS. 3 and 5, the cover panel 300 may includes an emission member 320 facing the display panel 200, with the buffering member 340 and the curved buffering member 350 between the emission member 320 and display panel 200. The emission member 320 is attached to the rear surface of the heat discharge member 310 and the curved buffering member 350. The emission member 320 blocks electro-magnetic interference generated from the printed circuit board PCB (refer, e.g., to FIG. 2). In addition, the emission member 320 may discharge heat generated from the display panel 200 together with the heat discharge member 310.

The emission member 320 includes one or more materials having superior heat conductivity and which block the electro-magnetic interference. Copper, nickel, and ferrite are examples of these materials. The emission member 320 may be attached to the heat discharge member 310 and the bracket 500 (refer, e.g., to FIG. 2).

Figure 7:
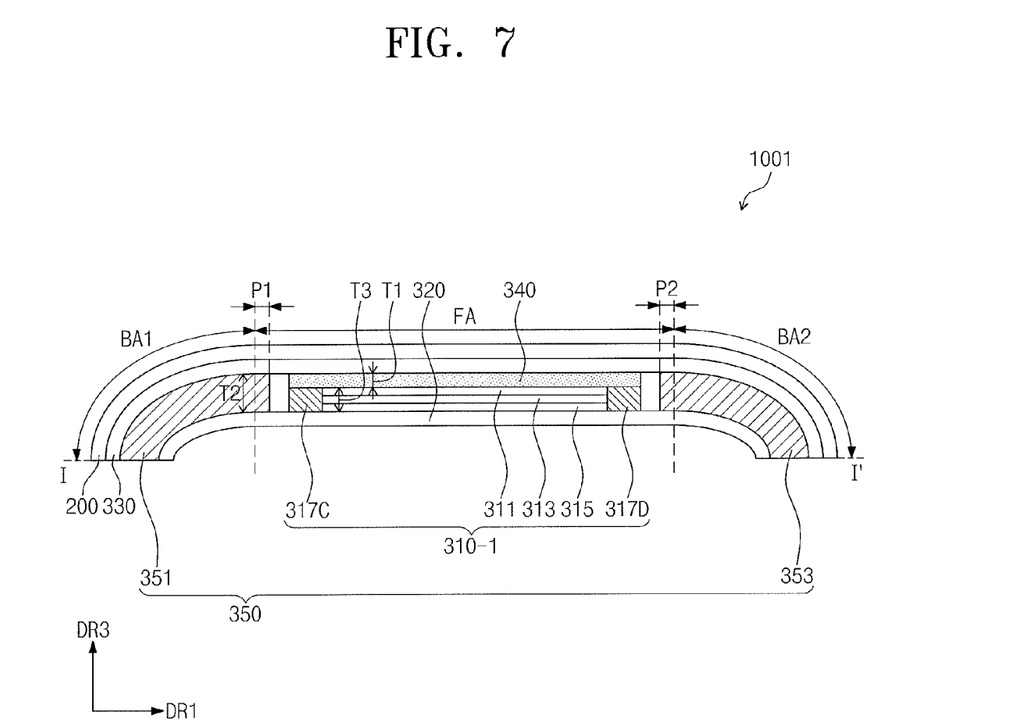
FIG. 7 illustrates another embodiment of a display apparatus.
Figure 8:
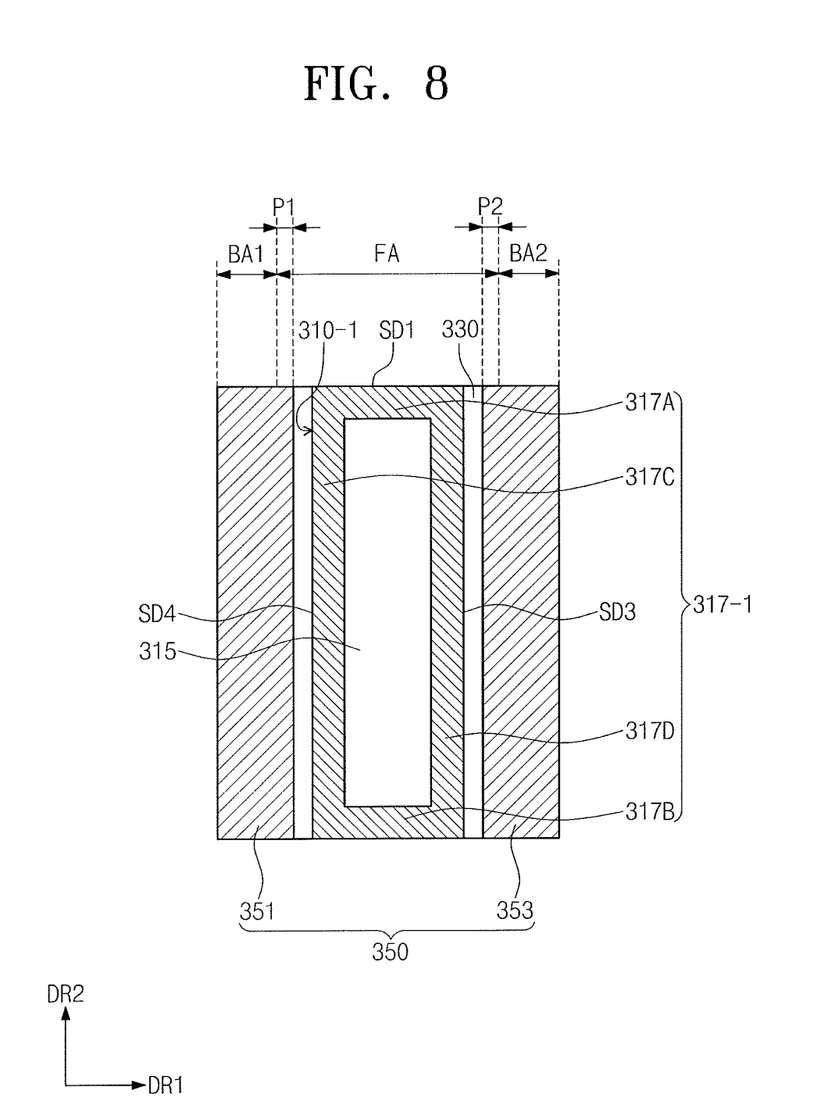
FIG. 8 illustrates the rear surface of another embodiment of a module.

FIG. 7 is a cross-sectional view showing another embodiment of a display apparatus 1001 taken along a line I-I' in FIG. 1, and FIG. 8 illustrates an embodiment of a rear surface of a module formed by coupling a light blocking member 330, a buffering member 340, a curved buffering member 350, and a heat discharge member 310-1 in FIG. 7.

The display apparatus 1001 in FIGS. 7 and 8 have the same structure and function as those of the display apparatus 1000 in FIGS. 3, 5, and 6, except for the heat discharge member 310-1. The heat discharge member 310-1 includes a heat discharge adhesive layer 311, a graphite layer 313, a protective layer 315, and a blocking layer 317-1. The heat discharge adhesive layer 311, the graphite layer 313, and the protective layer 315 have the same structure and function as in FIGS. 3, 5, and 6.

The blocking layer 317-1 is on the buffering member 340 and covers the side surface of the graphite layer 313 along a direction substantially parallel to an upper or rear surface of the graphite layer 313. In FIGS. 7 and 8, the blocking layer 317-1 covers the side surface of the graphite layer 313 in the first and second directions DR1 and DR2. The blocking layer 317-1 may include, for example, polyethylene terephthalate (PET).

The blocking layer 317-1 includes first, second, third, and fourth blocking layers 317A, 317B. 317C, and 317D. The first blocking layer 317A extends along the first side SD1 and the second blocking layer 317B extends along the second side SD2. The first and second blocking layers 317A and 317B face each other in the second direction DR2, with the heat discharge adhesive layer 311, the graphite layer 313, and the protective layer 315 between the first and second blocking layers 317A and 317B.

The third blocking layer 317C extends along the third side SD3 and the fourth blocking layer 317D extends along the fourth side SD4. The third and fourth blocking layers 317C and 317D face each other in the first direction DR2, with the heat discharge adhesive layer 311, the graphite layer 313, and the protective layer 315 between the third and fourth blocking layers 317C and 317D.

Figure 9:
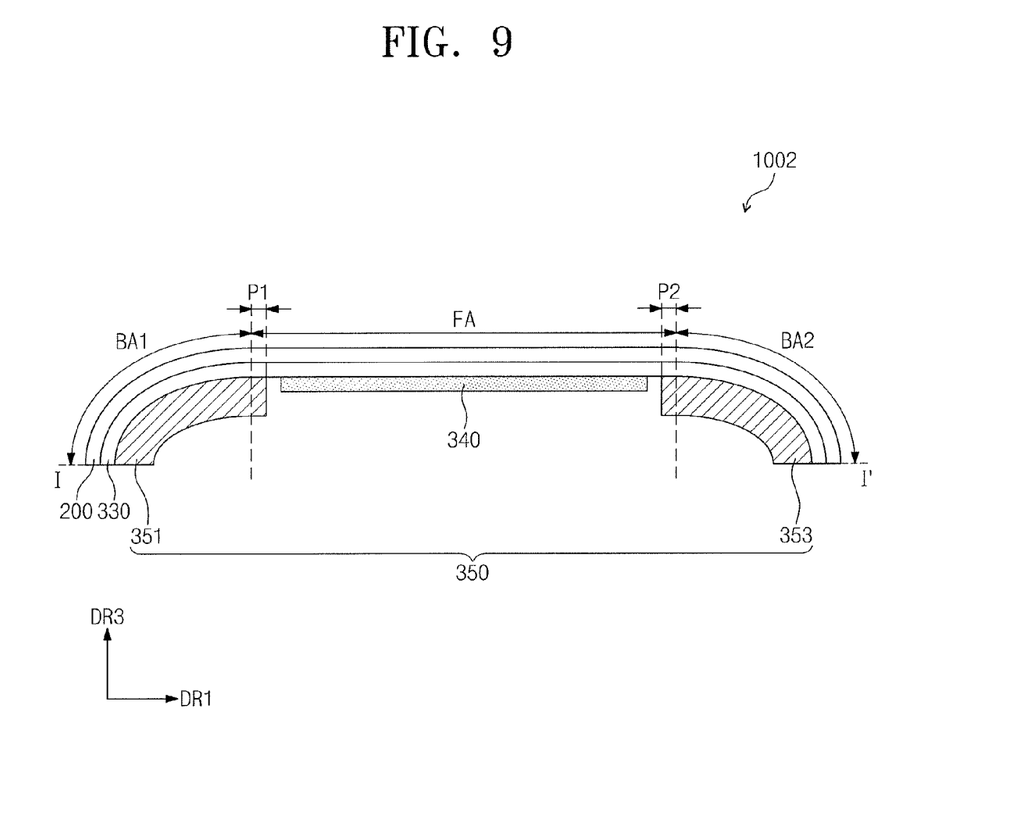
FIG. 9 illustrates another embodiment of a display apparatus.

FIG. 9 is a cross-sectional view of another embodiment of a display apparatus 1002 taken along line I-I' in FIG. 1. The display apparatus 1002 has the same structure and function as the display apparatus 1000 in FIG. 3, except that the display apparatus 1002 does not include the heat discharge member 310 and the emission member 320.

Referring to FIG. 9, since the display apparatus 1002 does not include the heat discharge member 310 and the emission member 320, the flat portion FA is slimmer and impact resistance of the curved portions BA1 and BA2 is improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A display apparatus, comprising:
   a display panel including a curved portion adjacent to a flat portion;
   a buffer overlapping the flat portion and having a first thickness;
   a curved buffer on a same layer as the buffer and overlapping the curved portion; and
   a curved support under the buffer, curved buffer, and display panel, the buffer and the curved buffer between the curved support and the display panel, and the curved buffer having a second thickness greater than the first thickness, wherein the buffer is separated from the curved buffer by at least one space in an area overlapping the flat portion of the display panel.

2. The display apparatus as claimed in claim 1, wherein:
   the curved portion includes a first curved portion facing a second curved portion,
   the flat portion is between the first and second curved portions, and
   the at least one space is between the flat portion and one of the first curved portion and the second curved portion.

3. The display apparatus as claimed in claim 2, wherein:
   the first curved portion is substantially parallel to the second curved portion, and
   the curved buffer includes a first curved buffer overlapping the first curved portion and a second curved buffer overlapping the second curved portion.

4. The display apparatus as claimed in claim 3, wherein:
   the first curved buffer overlaps the first curved portion and a first portion of the flat portion connected to the first curved portion, and
   the second curved buffer overlaps the second curved portion and a second portion of the flat portion connected to the second curved portion.

5. The display apparatus as claimed in claim 1, wherein the second thickness is substantially one and half times greater than the first thickness.

6. The display apparatus as claimed in claim 1, further comprising:
   a light blocking layer between the display panel and the buffer and between the display panel and the curved buffer.

7. The display apparatus as claimed in claim 1, further comprising:
   a heat discharge layer facing the display panel,
   wherein the buffer is between the heat discharge layer and the display panel.

8. The display apparatus as claimed in claim 7, wherein the heat discharge layer overlaps the flat portion and does not overlap the curved portion.

9. The display apparatus as claimed in claim 7, wherein:
   the heat discharge layer has a third thickness, and
   a sum of the first thickness and the third thickness is substantially equal to or less than the second thickness.

10. The display apparatus as claimed in claim 7, wherein:
    the curved portion is adjacent to the flat portion in a first direction and extends in a second direction crossing the first direction, and
    the heat discharge layer includes:
    a graphite layer;
    a heat discharge adhesive layer between and to attach the buffer and the graphite layer;
    a protective layer facing the heat discharge adhesive layer, with the graphite layer between the heat discharge adhesive layer and the protective layer; and
    a blocking layer overlapping a portion of a side surface of the graphite layer in the first direction or the second direction.

11. The display apparatus as claimed in claim 10, wherein:
    the heat discharge layer includes a first side extending in the first direction, a second side substantially parallel to the first side, a third side extending in the second direction, and a fourth side substantially parallel to the third side, and
    the blocking layer includes a first blocking layer extending along the first side and a second blocking layer extending along the second side.

12. The display apparatus as claimed in claim 11, wherein the first and second blocking layers face each other in the second direction, and wherein the heat discharge adhesive layer, the graphite layer, and the protective layer are between the first and second blocking layers.

13. The display apparatus as claimed in claim 11, wherein the blocking layer includes:
    a third blocking layer extending along the third side; and
    a fourth blocking layer extending along the fourth side.

14. The display apparatus as claimed in claim 13, wherein:
    the third and fourth blocking layers face each other in the first direction, and
    the heat discharge adhesive layer, the graphite layer, and the protective layer are between the third and fourth blocking layers.

15. The display apparatus as claimed in claim 1, further comprising:
    an emission layer facing the display panel,
    wherein the buffer and the curved buffer are between the emission layer and the display panel.

16. The display apparatus as claimed in claim 15, wherein the emission layer is attached to the curved buffer.

17. A portable terminal, comprising:
- a display panel including a curved portion connected to a flat portion;
- a buffer overlapping the flat portion and having a first thickness; and
- a curved buffer on a same layer as the buffer and overlapping the curved portion; and
- a curved support under the buffer, curved buffer, and display panel, wherein the buffer is separated from the curved buffer by at least one space in an area overlapping the flat portion of the display panel, wherein the buffer and the curved buffer are between the curved support and the display panel, and wherein the curved buffer having a second thickness greater than the first thickness.

18. The portable terminal as claimed in claim 17, further comprising:
- a light blocking layer between the display panel and the buffer and between the display panel and the curved buffer;
- a heat discharge layer overlapping the flat portion, not overlapping the curved portion, and facing the display panel, wherein the buffer is between the heat discharge layer and the display panel; and
- an emission layer facing the display panel, wherein the buffer and the curved buffer are between the emission layer and the display panel and are attached to the curved buffer and the heat discharge layer.

19. The portable terminal as claimed in claim 17, further comprising: a window above the display panel.

20. The portable terminal as claimed in claim 17, wherein the display panel is an organic light emitting display panel.

21. A display apparatus, comprising:
- a display panel including a curved portion adjacent to a flat portion;
- a buffer overlapping the flat portion and having a first thickness;
- a curved buffer on a same layer as the buffer and overlapping the curved portion;
- a curved support under the buffer, curved buffer, and display panel; and
- a light blocking layer between the display panel and the buffer and between the display panel and the curved buffer, wherein the buffer is separated from the curved buffer by at least one space in an area overlapping the flat portion of the display panel, and wherein the buffer and the curved buffer are directly contact with the light blocking layer, and the curved buffer has a second thickness greater than the first thickness, and the curved buffer and the curved support curve in a same direction.

* * * * *